United States Patent [19]

Price

[11] 4,140,926
[45] Feb. 20, 1979

[54] INVERTED TRANSISTOR CIRCUITS FOR MONOLITHIC INTEGRATED CIRCUIT APPLICATION

[75] Inventor: John J. Price, Mesa, Ark.

[73] Assignee: Motorola, Inc., Schaumburg, Ill.

[21] Appl. No.: 826,578

[22] Filed: Aug. 22, 1977

[51] Int. Cl.² .................... H03K 5/08; H03K 17/04
[52] U.S. Cl. ................................ 307/237; 330/300; 330/303; 330/313; 307/355; 330/252; 330/257; 330/284
[58] Field of Search ............... 307/213, 237, 254, 255, 307/355, 362, 300, 313, 303, 214; 330/252, 257, 284

[56] References Cited

U.S. PATENT DOCUMENTS

| | | | |
|---|---|---|---|
| 3,491,251 | 1/1970 | Witsell | 307/214 X |
| 3,564,281 | 2/1971 | Tokunaga et al. | 307/214 |

OTHER PUBLICATIONS

A.I.E.E. Transactions Part I – Communication and Electronics, vol. 74., No. 1, Mar. 1955, pp. 111–121, "Junction Transistors Used as Switches" R. L. Bright.

*Primary Examiner*—John Zazworsky
*Attorney, Agent, or Firm*—Michael D. Bingham

[57] ABSTRACT

A plurality of inverted transitor current mirror and pull down circuits are disclosed which are suitable for providing current mirroring and base pull down functions in a variety of integrated circuit applications. The use of the inverted transistor as a current mirror is also utilized in gaining and/or level shifting any differential or single-ended analog or digital signal. The use of a multiple emitter inverted transistor for providing multiple pull down reduces to a fraction the chip area otherwise required by the use of multiple transistors.

15 Claims, 5 Drawing Figures

INVERTED TRANSISTOR CIRCUITS FOR MONOLITHIC INTEGRATED CIRCUIT APPLICATION

BACKGROUND OF THE INVENTION

This invention relates to current mirroring circuits and the use thereof in a plurality of integrated circuit applications and more particularly, to a plurality of inverted transistor current mirroring and pull down circuits for such applications.

The prior art is replete with different types of integrated circuits having current mirroring circuits. For example, current mirroring circuits are utilized in differential amplifier circuits to reduce input voltage offset errors at the quiescent operating state of such amplifiers. Such current mirroring circuits are also utilized in gaining and/or level shifting any differential or single-ended signal.

Presently, some prior art current mirroring circuits utilize a diode, more commonly, a diode-connected transistor connected in parallel with the base-emitter junction of a transistor. The diode and transistor are then connected in the collector circuitry of the differential amplifier as is understood. Equal quiescent currents are established by making the PN junctions of the diode and transistor equal in area as is known. An additional, but less accurate, method for providing current mirroring is to utilize a base pull down resistor in place of the diode. Both of these circuits are illustrated hereinafter.

In the design of large scale integrated (LSI) circuits chip space is often limited. Therefore, a need exists for reducing the number of components and devices required to perform standard circuit functions, e.g., current mirroring. A disadvantage of the prior art current mirroring circuits is that at least two component devices are required to provide this function, each requiring a minimum area on the chip. Thus a need exists for reducing component count required for providing the current mirroring function to subsequently reduce required chip area.

In some comparator circuit applications it is desirous to ensure that an output signal is generated only when the input signal is of a particular polarity and to positively inhibit any output signal if the input signal is of the opposite polarity. In these prior art circuits, current mirroring is utilized to drive multiple devices to actively pull down the output of the comparator to essentially ground reference to inhibit any output signal. Again, however, the use of multiple component devices is required to provide this function and these techniques suffer from the same disadvantages discussed above.

The present invention overcomes the problems of the above circuits by utilizing inverted transistor current mirroring and pull down circuits to minimize component count. The use of a single inverted transistor with multiple emitters to provide the above functions significantly reduces to a fraction the area required on the chip by multiple transistors. Inverted transistors as used in applications herein are typical vertical bipolar transistors wherein the emitter electrodes are utilized as collectors with the collector electrodes functioning as emitters as is known in the art.

SUMMARY OF THE INVENTION

Accordingly, it is an object of the present invention to provide improved current mirroring circuits for use in integrated circuit applications.

It is another object of the invention to provide an improved current mirroring and active pull down circuit for use in an integrated circuit.

Still another object of the present invention is to provide a current mirroring circuit utilizing an inverted transistor to minimize component count.

A further object of the invention is to provide a simple current mirror for use in integrated circuit applications which provides active pull down to inhibit output signals from the integrated circuit when the input to the circuit is at a predetermined polarity.

The inverted transistor circuit configurations of the invention are suitable for providing current mirroring for active pull down and current limiting applications. Moreover, these inverted transistor circuits provide simple mirror circuits to reduce component count and therefore to reduce the space required to fabricate the circuit on the integrated chip.

In one feature of the invention a simple current mirror circuit is provided which comprises an inverted transistor coupled to an active circuit means, which for example, may be a differential amplifier included in a monolithic circuit.

In another feature of the invention, the monolithic circuit comprises a pull down circuit including an inverted transistor for providing current mirroring and active pull down for positively inhibiting any output signal from an active circuit means which is coupled to the pull down circuit.

In yet another feature of the invention a current limiter circuit is provided for limiting the output current of an operational amplifier. The current limiter circuit includes a current sensing circuit for providing a limiting signal when the output current exceeds a predetermined value and a pull down circuit including an inverted transistor which is responsive to the limiting signal for limiting the output current.

DETAILED DESCRIPTION OF THE EMBODIMENTS

Figure 1:
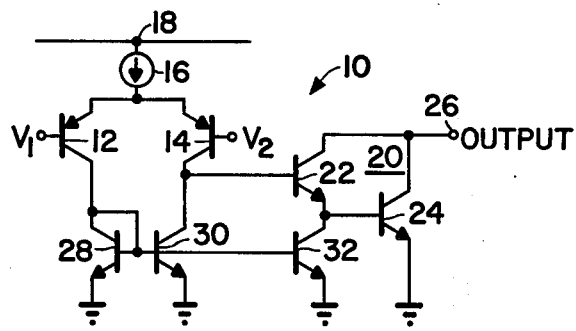
FIG. 1 is a schematic diagram of a differential amplifier including a conventional current mirror and pull down circuit.
Figure 2:
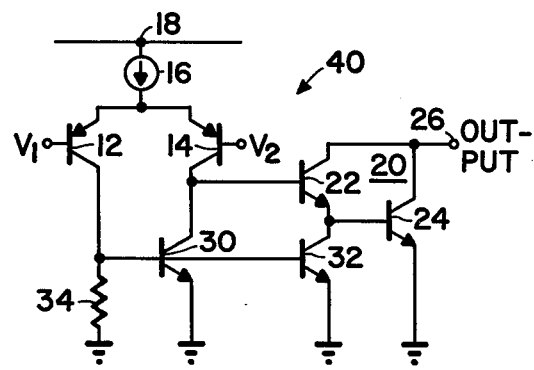
FIG. 2 is a differential amplifier shown in schematic form including an alternate current mirror and pull down circuit.

Alternative methods for providing current mirroring and active circuit pull down will first be described along with some problems associated therewith so that the advantages of the circuits of the present invention can be more fully appreciated. Referring to FIGS. 1 and 2, the same reference numbers are used for like components. Differential amplifier or comparators 10 and 40, which are suitable to be manufactured in monolithic integrated circuit form, are shown as including differentially connected transistor pairs 12 and 14. Transistors 12 and 14 are, for example, PNP transistors having emitter electrodes thereof coupled to current source 16 which provides current to the transistors and which is connected at terminal 18 to a suitable power supply bus line. The base electrodes of transistors 12 and 14 are adapted to receive differential input voltages $V_1$ and $V_2$ respectively. For discussion purposes, without being limited thereto, the voltage $V_2$ may be considered as being at a reference potential. The voltage $V_1$ will be considered as being either in an "on" or "off" state. The collector electrode of transistor 14 is connected to the input of Darlington output stage 20 consisting of transistors 22 and 24. The output of both amplifier 10 and 40 is provided at terminal 26, the output of Darlington amplifier 20.

In FIG. 1, a current mirror and active pull down circuit is provided by diode connected transistor 28, transistor 30 (which are coupled to the collector output circuitry of respective transistors 12 and 14) and transistor 32. The amplifier 10 functions in a known manner to produce an output signal only when transistor 14 is rendered conductive. Transistor 14 is conductive when the voltage $V_1$ is greater in magnitude than voltage $V_2$. Conversely, when the voltage $V_1$ is less than the voltage $V_2$ then transistor 12 is conductive and transistor 14 is rendered nonconductive.

A problem arises in amplifier circuits 10 and 40 due to the high current gain of Darlington amplifier section 20. If for some reason a small trickle current should occur at the base of transistor 22 of Darlington amplifier 20, it is entirely possible that a false output signal could occur even though transistor 14 is in an off state. To prohibit this possibility, the aforementioned current mirror and pull down circuit is provided to inhibit any output signal from occurring when transistor 12 is conducting. When transistor 12 is rendered conductive, transistor 28 is turned on and current is mirrored to transistors 30 and 32 which saturate. With transistors 30 and 32 in a saturated state the bases of transistors 22 and 24 are essentially clamped to a ground reference potential through these saturated transistors. Hence, transistors 22 and 24 are positively biased in an off state such that the Darlington amplifier cannot be rendered conductive whenever transistor 12 is conductive.

However, transistors 30 and 32 being in a saturated state increases the switching time decreasing the speed of operation of the circuit comprising amplifier 10. As is understood, a finite time is required to change operating states of the differential amplifier due to the time it takes to bring transistors 30 and 32 out of saturation because of the storage time delay phenomenon. Thus, differential amplifier 10 may not be able to switch between states fast enough for some applications.

An alternate method which may be used to provide current mirroring and active pull down is to replace diode connected transistor 28 (FIG. 1) with resistor 34. Thus in a like manner as differential amplifier 10, with transistor 12 being conductive, transistors 30 and 32 are in a saturated state and clamp the bases of transistors 22 and 24 respectively to substantially ground potential. Resistor 34, besides pulling the base electrodes of transistors 30 and 32 to less than one base-to-emitter voltage drop to prevent conduction thereof when transistor 14 is rendered conductive also provides a discharge path for discharging the storage charge in transistors 30 and 32.

Differential amplifier 40 suffers from the same disadvantages as differential amplifier 10 in that a finite time is required to switch operating states of transistors 12 and 14 because of the storage delay time caused by transistors 30 and 32 being in a saturated state when transistor 12 is conducting. In both differential amplifier circuits, the storage delay time is a function of the high current gain ($\beta$) of transistors 30 and 32. Because of the high current gain, a larger storage charge is developed between the base-emitter junction of transistors 30 and 32 which subsequently must be discharged through resistor 34 before the Darlington output amplifier section can be rendered conductive.

Figure 3:
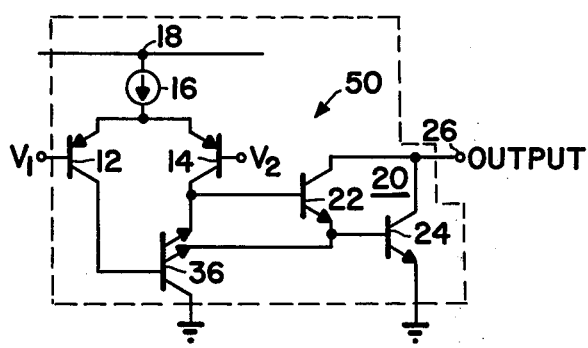
FIG. 3 is a schematic diagram of a differential amplifier including a current mirror and pull down circuit of an embodiment of the present invention.

Referring to FIG. 3, there is shown differential amplifier 50 of a first embodiment of the invention which overcomes the problem associated with the aforedescribed amplifiers. Differential amplifier 50 includes: an active circuit portion comprising current source 16, transistors 12, 14 and Darlington amplifier section 20. Amplifier 50 operates in the same manner as amplifiers 10 and 40. To overcome the speed problems of the aforementioned amplifiers, amplifier 50 includes a vertical NPN transistor 36 which operates as an inverted transistor. The operation and construction of inverted transistor 36 is fully described for example in the magazine article by C. M. Hart, A. Slob, and H. E. Wulms, "Bipolar LSI Takes a New Direction With Integrated Injection Logic," Electronics, October 3, 1974, pp 111-118. Briefly, transistor 36 is shown as including multiple emitter electrodes coupled respectively to the base electrodes of transistors 22 and 24. The normal collector electrode of inverted transistor 36 is coupled to ground reference and the base electrode thereof is coupled to the collector of transistor 12.

In operation, the emitter electrodes of inverted transistor 36 operate as multiple collectors and the collector electrode as an emitter. With transistor 12 being rendered conductive, current is mirrored through inverted transistor 36 and the base electrodes of transistors 22 and 24 are pulled down to essentially ground reference potential in the same manner as previously described. Thus any output signal is positively prevented from occuring during the time duration that transistor 12 is rendered conductive.

The structure of differential amplifier 50 offers several significant advantages over the alternative arrangements shown in FIGS. 1 and 2. Firstly, the number of devices required to provide current mirroring and active pull down is reduced from three devices to a single multiple emitter device. This advantage becomes very significant in the production of large scale integrated (LSI) chips wherein chip area becomes a critical factor. By using multiple emitter inverted transistors, the chip area required for amplifier 50 is a fraction of that for either amplifier 10 or 40. For example, the area required for multiple emitter inverted transistor 36 is approximately only 20 percent greater than that for a single device such as transistor 28. Another advantage of amplifier 50 over the aforementioned amplifiers is the improved switching speed between operating states of the differential amplifier. Since the time required for inverted transistor 36 to come out of saturation is much less than for a normally constructed transistor, switching time between operating states is greatly improved. Also, there is no need for a pull down resistor such as resistor 34 (FIG. 2) since the inverted current gain ($\beta$)

of transistor 36 is typically one as opposed to typically one hundred for the normally connected transistor.

Figure 4:
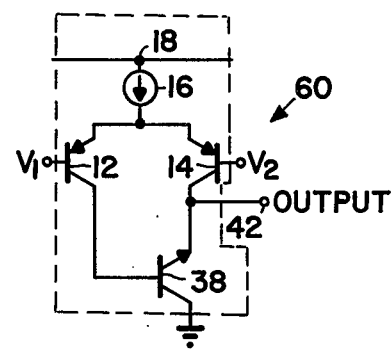
FIG. 4 is a schematic diagram of a differential amplifier including a simple current mirror circuit of another embodiment of the invention.

Referring to FIG. 4, there is shown differential amplifier 60 of another embodiment of the invention which includes inverted transistor 38. Inverted transistor 38 is utilized as both a current mirror and for single-ended differential amplifier 60. Inverted transistor 38 may also be utilized for level shifting such that the output signal developed at single ended output terminal 42 may be developed about a different voltage level than the differential input signal $V_1$, $V_2$ that is applied to the base electrodes of transistors 12 and 14. Moreover, because the inverted gain of transistor 38 is typically unity, input voltage offset error can be controlled thereby. The use of the single inverted transistor 38 eliminates the requirement for the current mirror circuitry of FIGS. 1 and 2 including either transistors 28 and 30 or resistor 34 and transistor 30. Again, at least one device has been eliminated by the use of an inverted transistor in the differential amplifier application.

Figure 5:
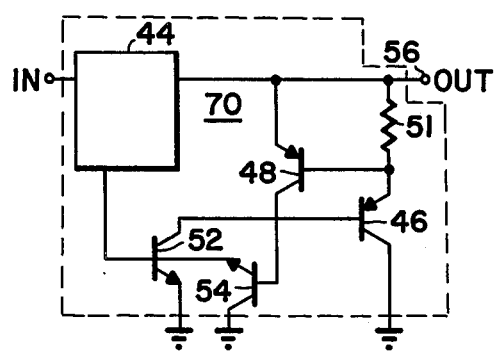
FIG. 5 is a schematic diagram illustrating a current limiter circuit of yet another embodiment of the invention.

Referring now to FIG. 5 there is shown yet another embodiment of the invention wherein the application of an inverted transistor is utilized to provide current mirroring (n a current limiting circuit. As illustrated, current limiting circuit 70 is coupled to an active circuit 44, for example an operational amplifier, and is utilized to limit the maximum output current of the active circuit. The MC-1458S, an operational amplifier sold by Motorola, Inc. shows a typical connection of a current limiting circuit similar to circuit 70 to an active circuit such as circuit 44. Current limiting circuit 70 comprises a current sensing circuit including PNP transistors 46, 48 and resistor or circuit means 51, bias transistor 52 and inverted transistor 54.

In normal operation, bias transistor 52, which is responsive to a bias potential supplied thereto at the base electrode thereof from active circuit 44, biases transistor 46 in an on condition and current flows therethrough from active circuit 44 and resistor 51 (which is coupled to the active circuit 44 at output 56). Transistor 48 is biased off as the voltage drop across resistor 51 is not sufficient to bias the transistor to an on condition. Thus inverted transistor 54 is also nonconductive. In response to the output current from active circuit 44 exceedng a predetermined maximum limit, transistor 46 is caused to conduct more such that the voltage drop across resistor 51 biases transistor 48 to a conductive state. Because the $\beta$ of inverted transistor 54 is typically one, the collector current developed by transistor 48 is mirrored through the inverted transistor which then steals the equivalent amount of current from the base drive of transistor 52. This in turn limits the base drive of transistor 46 and therefore limits the current therethrough. Thus if current limiting circuit 70 is in the output circuitry of active circuit 44 the output current therefrom is limited to a maximum value. The advantage of current limiting circuit 70 over other similar methods for providing current limiting is that the circuit is not responsive to any leakage current which might occur through transistor 48, since the $\beta$ of transistor 54 is very low. For instance, whatever leakage current is conducted to the base of inverted transistor 54 is conducted therethrough which has little effect upon the operation of the circuit. Therefore inverted transistor 54 can be used alone for a current mirror and pull down circuit. However, in most typical current limit circuits a current mirror circuit comprising a normally connected transistor and either a diode or resistor is required in place of inverted transistor 54 to eliminate any leakage current problems. If these conventional circuits used only a single transistor, because the $\beta$ of the transistor is very high, any leakage current from transistor 48 could cause transistor 46 to be rendered nonconductive to shut down the active circuit when not desired. Thus to prevent such occurrence a current mirror circuit is required in the conventional circuits. However, current limiting circuit 70 overcomes these leakage problems utilizing a single inverted device with its inherent advantage over conventional circuits.

In summary, the foredescribed circuits utilizing inverted transistors have several significant advantages over conventional and alternate circuits providing the same function. The number of devices required is minimized, the use of multiple emitters inverted transistors also reduces the area required for fabrication of The circuits in an integrated circuit. The speed of switching circuits utilizing the current mirrors of the present invention are greatly improved over conventional circuits since the time inverted an inerted transistor to come out of saturation is much less than a normally connected transistor. Finally, protection to leakage current problems is provided by the inverted transistor circuits of the present invention.

What is claimed is:

1. A monolithic integrated circuit comprising:
   active circuit means responsive to an applied input signal for producing at an output terminal thereof an output signal; and
   an inverted transistor coupled to the active circuit means for providing current mirroring and for limiting said output signal to a predetermined value when said inverted transistor is rendered conductive by said active circuit means.

2. The monolithic circuit of claim 1 wherein:
   said active circuit means includes first and second differentially connected transistors which are adapted to receive the input signal across respective input electrodes for producing a differential output signal at respective output electrodes thereof, said output electrode of said first transistor being coupled to said output terminal of said active circuit means; and
   said inverted transistor having first, second and control electrodes, said control electrode being coupled to said output electrode of said second transistor, said first electrode being coupled to said output electrode of said first transistor and said second electrode being coupled to a reference potential, said inverted transistor being responsive to said differential output signal being in a first output state for causing the value of said output signal at said output terminal to be substantially at said reference potential.

3. The monolithic circuit of claim 2 wherein said active circuit means further includes an amplifier output stage coupled between said output electrode of said first transistor and said output terminal of said active circuit means.

4. The monolithic circuit of claim 3 wherein:
   said amplifier output stage includes third and fourth transistors each having first, second and control electrodes, said second electrodes of said third and fourth transistors being interconnected and coupled to said output terminal of said active circuit means, said control electrode of said third transistor being coupled to said output electrode of said first transistor, said control electrode of said fourth transistor being connected to said first electrode fo said third transistor, said first electrode of said fourth transistor being coupled to said reference potential; and said inverted transistor further includes an additional electrode coupled to said control electrode of said fourth transistor such that said control electrode of said fourth transistor is maintained at said reference potential value when said differential output signal is in said first output state whereby no output signal is produced at said output terminal during the time duration that said differential output signal is in said first state.

5. The monolithic circuit of claim 1 wherein said active circuit means comprises a current limiting ciruit coupled between the output terminal of said active circuit means and a first node thereof for limiting the current conducted by said active circuit including current sensing means for producing a current limiting signal in response to the value of said current being conducted through said active circuit means to said current sensing means becoming greater than a predetermined value and said inverted transistor being rendered conductive by said current limiting signal to cause the value of current being conducted through said current sensing means to be reduced such that the output current produced from the monolithic circuit is maintained at said predetermined value.

6. The monolithic circuit of claim 5 wherein:
said current sensing means includes first transistor means having first, second and control electrodes, said control electrode being coupled to said active circuit means to receive a biasing input signal, said second electrode being coupled to a reference potential, circuit means coupled between said output of said active circuit means and said first electrode of said first transistor means for developing a signal thereacross having a magnitude which varies in accordance with the magnitude of current being conducted therethrough from said active circuit means, second transistor means responsive to the signal developed across said circuit means reaching said predetermined value for producing said current limiting signal, said second transistor means having first, second and control electrodes, said first and control electrodes being coupled respectively to said output of said active circuit means and to said first electrode of said first transistor means; and
said inverted transistor having first, second and control electrodes, said control electrode being coupled to said second electrode of said second transistor means, said first electrode being coupled to said control electrode of said first transistor means and said second electrode being coupled to said reference potential, said inverted transistor being rendered operative by said current limiting signal from said second transistor means for reducing the value of said biasing signal to said first transistor means such that the value of current conducted through said active circuit means is reduced accordingly.

7. In a monolithic comparator circuit including a differential input stage which receives differential input signals for producing a differential output signal at outputs thereof having first and second states depending upon the respective magnitudes of said differential input signals and an amplifier output stage coupled to a respective output of the differential input stage for producing an output signal when said differential output signal from said differential input stage is in the first state, the improvement comprising pull down circuit means coupled to the input of the amplifier output stage for positively causing the value of the input signal applied to the input of the amplifier output stage to be substantially at a reference potential such that the amplifier output stage is rendered non-conductive when the differential output signal is in the second state thereby preventing any output signal from being produced therefrom, said pull down circuit means including a inverted transistor coupled between the outputs of the differential input stage and said reference potential.

8. The monolithic circuit of claim 7 wherein:
the amplifier output stage includes at least two transistors each having base, emitter and collector electrodes interconnected so as to form a Darlington amplifier with said collector electrodes being interconnected to the output of the amplifier output stage; and
said inverted transistor includes a base electrode coupled to a first output of the differential input stage, first and second emitter electrodes coupled respectively to said base electrodes of said two transistors of the amplifier output stage and a collector electrode coupled to said reference potential.

9. In a monolithic circuit including an active circuit portion for generating an output signal at an output thereof in response to an applied input signal, the improvement comprising current limiting means coupled to the active circuit portion for regulating the current conducted through the active circuit means including current sense means having first and second inputs coupled to the active circuit means for sensing the magnitude of the current conducted therethrough from the active circuit means which is applied at said first input to produce a current limit output signal at an output therof when said magnitude of current conducted therethrough becomes greater than a predetermined value, said second input of said current sense means receiving a bias signal, and a transistor connected in an inverted mode between said second input and output of said current sense means which is responsive to said current limit signal for reducing said bias signal such that the current conducted through said current sense means is regulated.

10. The monolithic circuit of claim 9 wherein:
said current sense means includes a first transistor having base, collector and emitter electrodes, said base electrode receiving said bias signal, said collector electrode being coupled to a reference potential, circuit means coupled between said first input of said current sense means and said emitter electrode of said first transistor, and a second transistor having base, emitter and collector electrodes, said emitter electrode being coupled to said first input of said current sense means, said base electrode being coupled to said emitter electrode of said first transistor, said collector electrode being said output of said current sense means; and
said transistor being connected in an inverted mode having base, collector and emitter electrodes said emitter electrode being coupled to the second input of said current sense means, and base electrode being coupled to said output of said current sense means and said collector electrode being coupled to said reference potential.

11. Th monolithic circuit of claim 10 wherein:

said current sense means includes a third transistor having base, emitter and collector electrodes, said base electrode being coupled to said second input of said current sense means, said collector electrode being coupled to said base electrode of said first transistor and said emitter electrode being coupled to said reference potential; and said circuit means being a resistor.

12. In a monolithic integrated amplifier circuit having input and output terminals the improvement comprising current mirroring means including a transistor operated in an inverted mode which is coupled between output terminals of the amplifier circuit and a ground reference potential for providing mirroring of current when said transistor operated in an inverted mode is rendered conductive by the amplifier circuit.

13. A circuit of claim 12 wherein:

the amplifier circuit includes first and second differentially connected transistors with respective base electrodes coupled to the input terminals of the amplifier circuit and a Darlington output stage having an input coupled to the collector electrode of said first transistor and an output coupled to the output terminal of the amplifier circuit;

said transistor operated in an inverted mode having a control electrode coupled to the collector electrode of said second transistor, a first electrode coupled to said input of said Darlington output stage and a second electrode coupled to said ground reference potential.

14. The circuit of claim 13 wherein:

said Darlington output stage comprises third and fourth transistors each having base, emitter and a collector electrodes, said collector electrodes being intercoupled to each other and to said output of the Darlington output stage, said base electrode of said third transistor being said input of said Darlington output stage, said emitter electrode of said fourth transistor being coupled to said ground reference potential; and said transistor operated in an inverted mode having a third electrode coupled to the interconnected emitter and base electrodes of said third and fourth transistors, the potential appearing at said first and third electrodes of said transistor operated in an inverted mode being caused to be near ground potential when said transistor is rendered conductive by the amplifier circuit such that said Darlington output stage is rendered non-conductive at such time.

15. The circuit of claim 12 wherein:

the amplifier circuit includes an operational amplifier and a current limiting circuit coupled with said operational amplifier, said current limiting circuit having an input coupled to an output of said operational amplifier and an output coupled to the output of the amplifier circuit and current sensing means for producing a current limiting control signal when the output current produced by said operational amplifier exceeds a predetermined value; and said transistor operated in a inverted mode receiving said current limiting control signal for limiting the current appearing at the output of the current limiting circuit to said predetermined value, said transistor operated in an inverted mode having first, second and control electrodes, said control electrode being coupled to the input of the current limiting circuit, said second electrode being coupled to said ground potential and said control electrode receiving thereat said current limiting control signal.

* * * * *